(12) United States Patent
Yamaguchi et al.

(10) Patent No.: US 7,190,438 B2
(45) Date of Patent: Mar. 13, 2007

(54) NEAR-FIELD EXPOSURE APPARATUS AND NEAR-FIELD EXPOSURE PHOTOMASK

(75) Inventors: Takako Yamaguchi, Kanagawa (JP); Ryo Kuroda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 407 days.

(21) Appl. No.: 10/779,786

(22) Filed: Feb. 18, 2004

(65) Prior Publication Data

US 2004/0166421 A1    Aug. 26, 2004

(30) Foreign Application Priority Data

Feb. 20, 2003    (JP) ............................. 2003-042090

(51) Int. Cl.
  *G03B 27/02*    (2006.01)
  *G03B 27/14*    (2006.01)
  *G03F 1/00*    (2006.01)
  *G03F 1/14*    (2006.01)

(52) U.S. Cl. ............................................ 355/78; 430/5
(58) Field of Classification Search ................... 430/5; 355/78
  See application file for complete search history.

(56) References Cited

U.S. PATENT DOCUMENTS

| | | | |
|---|---|---|---|
| 4,888,488 A * | 12/1989 | Miyake ........................ | 355/78 |
| 6,171,730 B1 | 1/2001 | Kuroda et al. .................. | 430/5 |
| 6,187,482 B1 | 2/2001 | Kuroda et al. .................. | 430/5 |
| 6,559,926 B2 | 5/2003 | Yamaguchi et al. ........... | 355/53 |
| 6,628,392 B2 | 9/2003 | Kuroda et al. ............... | 356/400 |
| 6,632,593 B2 | 10/2003 | Yamaguchi et al. ......... | 430/322 |

FOREIGN PATENT DOCUMENTS

| | | | |
|---|---|---|---|
| EP | 1150162 A2 | * | 10/2001 |
| JP | 61065250 A | * | 4/1986 |
| JP | 11-145051 | | 5/1999 |

OTHER PUBLICATIONS

English Translation of previously cited Nakamura et al. (JP 61-65250 A) Adhesion-Type Glass Mask, 1986.*

* cited by examiner

*Primary Examiner*—Mark F. Huff
*Assistant Examiner*—John Ruggles
(74) *Attorney, Agent, or Firm*—Fitzpatrick, Cella, Harper & Scinto (57) ABSTRACT

A near-field exposure apparatus including a light source, a stage on which an object to be exposed to light is placed, and a photomask with a deformable membrane portion having on a first surface a light shielding membrane that has a micro aperture and a substrate for supporting a peripheral region of a second surface of the deformable membrane portion. Exposure is conducted with the deformable membrane portion in a sagged condition. The photomask has a stress relieving structure to relieve stress that is generated at a border between the deformable membrane portion and the substrate when the deformable membrane portion sags. The stress relieving structure is one of: a reinforcing member placed at the border, the substrate being partially thinned near the border, and an intermediate layer that is formed between the substrate and the second surface of the deformable membrane portion.

2 Claims, 10 Drawing Sheets

NEAR-FIELD EXPOSURE APPARATUS AND NEAR-FIELD EXPOSURE PHOTOMASK

BACKGROUND OF THE INVENTION

1. Field of the Invention

The present invention relates to a photomask for near-field exposure, a near-field exposure method, and a near-field exposure apparatus with which a minute pattern can be formed.

2. Related Background Art

As semiconductor memories are increasing in capacity, and CPU processors are enhanced in processing speed and level of integration, further miniaturization of photolithography is becoming indispensable. In general, the ability of a photolithography apparatus for fine processing is limited by the wavelength of light used by the apparatus.

With the trend being that light having a shorter wavelength is used in photolithography apparatuses, ultraviolet lasers are now employed, allowing fine processing on the order of 0.1 µm.

After all this advancement in miniaturization, photolithography still has many problems to clear up in order to achieve fine processing of 0.1 µm or finer. For instance, further shortening of the laser wavelength and development of a lens that works for that shorter wavelength range are required.

There has been proposed, as a measure for allowing optical fine processing of 0.1 µm or finer, a fine processing apparatus that uses the structure of a scanning near-field optical microscope (hereinafter, abbreviated as SNOM). For example, the apparatus uses evanescent light that seeps from a micro aperture with a size of 100 nm or less to perform on a resist local exposure that surpasses the limit of the wavelength of light.

However, any lithography apparatus that has the SNOM structure, which uses one (or more than one) processing probe to carry out fine processing has a problem that high throughput cannot be achieved.

U.S. Pat. No. 6,171,730 B1 (Japanese Patent Application Laid-Open No. H11-145051) discloses a method to solve this problem. According to the proposed method, a patterned photomask to let near-field light seep through a gap between shielding membranes is brought into close contact with a photoresist on a substrate, and then the photoresist is exposed to light, thereby transferring the whole minute pattern of the photomask onto the photoresist at the same time. The disclosed method is an excellent method and is of a great contribution to the technical field to which the present invention belongs.

The above-described near-field exposure method is capable of manufacturing a minute pattern of about several tens of nm, which is far smaller than the wavelength of exposure light. Accordingly, the above specification proposes to form a membrane portion in a photomask and to use pressure to let the membrane portion sag and to approach a photoresist to the near-field exposure region before the photoresist is exposed to light.

Figure 11A:
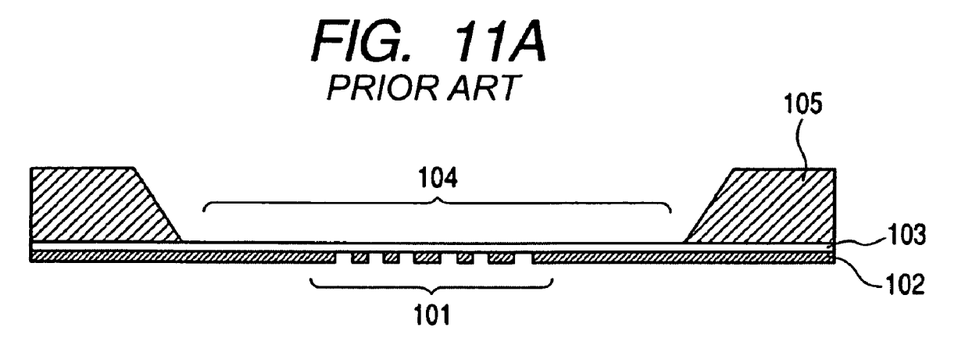
FIGS. 11A and 11B are diagrams showing the structure of a conventional photomask.
Figure 11B:
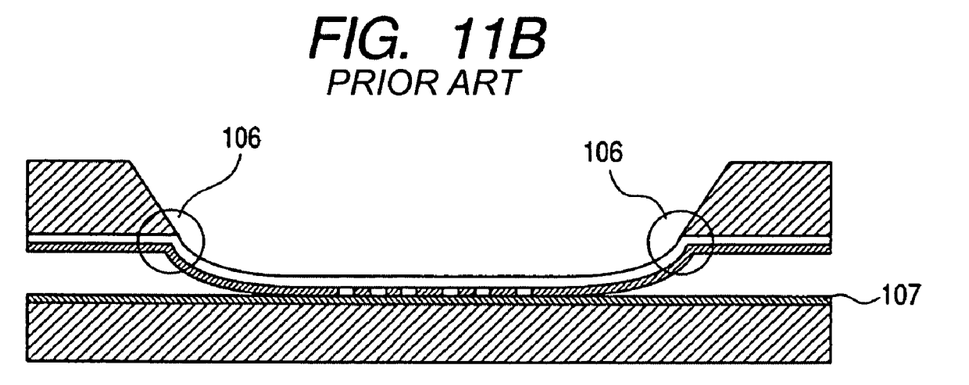

A description is given of light exposure that uses a photomask structured as shown in FIGS. 11A and 11B. In FIG. 11A, the photomask has a membrane portion 104, which is composed of a shielding membrane 102 and a membrane parent material 103. The shielding membrane 102 has a light exposure pattern 101.

In order to take full advantage of near-field exposure capable of manufacturing a minute structure beyond the limit of diffraction of light, it is necessary that the light exposure pattern 101 and a photoresist 107 approach each other to be in a near-field region (the distance between the two should be 100 nm or less, although it varies depending on the size of the light exposure pattern) during exposure. The membrane portion 104, therefore, sags upon exposure, so that the light exposure pattern is closely fitted to the photoresist (FIG. 11B).

The membrane portion that is brought into close contact with the resist is peeled off of the resist after exposure is completed. Under certain conditions, the membrane portion could be broken through repetitive fitting and peeling, thus making the photomask useless. When the membrane portion is torn, it mostly takes place at a border portion 106, which is the border between the membrane portion 104 and a substrate 105. This is probably because the stress caused by sagging of the membrane portion 104 locally concentrates on the border portion 106 between the substrate 105 and the membrane portion 104.

Figure 10:
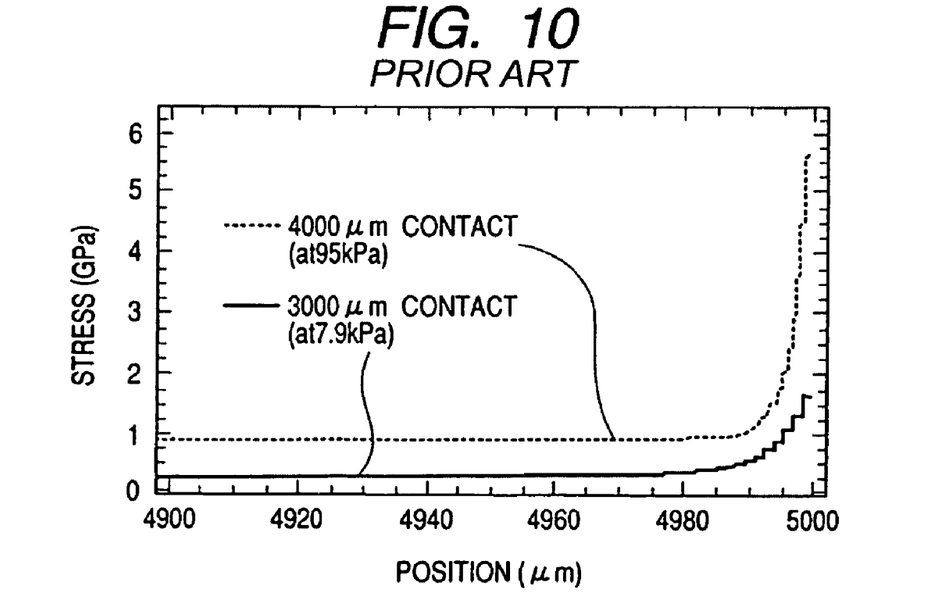
FIG. 10 is a diagram showing results of simulating stress applied to a membrane portion of a conventional photomask.

FIG. 10 shows a simulation of how the stress caused by sagging of the mask works on the membrane portion. In FIG. 10, the axis of the abscissa indicates the distance from the center of the membrane portion and the axis of the ordinate indicates tensile stress generated in the membrane portion. The membrane portion is 10 mm in diameter and the calculations are made accordingly.

As is clear from FIG. 10 and FIGS. 11A and 11B, the force applied to the membrane portion concentrates on the border portion 106 shown in FIGS. 11A and 11B, and the magnitude, as well as degree of concentration, of the force applied to the membrane portion is increased as the area where the photomask is in close contact with the photoresist is expanded. This means that the more the contact area is expanded to increase the light exposure pattern in size, the less durable the membrane portion becomes.

The magnitude of the force applied to the membrane portion is also dependent on the distance between the resist and the mask before the mask sags, and a larger force is applied to the membrane portion as the mask-resist distance is increased. In order to reduce the force applied to the membrane portion and to improve the durability of the photomask, the mask-resist distance should be set to be small. A fine, vertically-movable stage is necessary to control a small distance with precision. For instance, when exposing a photoresist to light by the step-and-repeat method in a stepper exposure apparatus, the position of the photoresist relative to a photomask is changed in a short period of time during exposure and it is, therefore, undesirable to raise the positional precision excessively, since it takes time. In addition, this makes the stage costly. As has been described, it is difficult to raise the precision of the mask-resist distance, in other words, to reduce the distance between the resist and the mask before the mask sags.

SUMMARY OF THE INVENTION

The present invention has been made in view of the above, and an object of the present invention is, therefore, to provide a photomask for near-field exposure, which has a membrane portion and which is hard to break, and is durable even when used for exposure of a large area to light.

Another object of the present invention is to provide a photomask for near-field exposure whose membrane portion is durable even when the mask-resist distance is large.

A photomask for near-field exposure according to the present invention includes the following aspects.

(1) A photomask for near-field exposure, including:
a substrate; and
a membrane portion supported by the substrate and having on one side of the membrane portion a shielding membrane that has a micro aperture,
in which the photomask has such a structure as to relieve stress that is generated in the border between the membrane portion and the substrate when the membrane portion sags.

(2) A photomask for near-field exposure according to aspect (1), in which the structure disperses, over the membrane portion, deformation of the membrane portion at the border between the membrane portion and the substrate.

(3) A photomask for near-field exposure according to aspect (2), in which the structure has a thick part in a region of the membrane portion that abuts the border between the membrane portion and the substrate.

(4) A photomask for near-field exposure according to aspect (3), in which the structure is such that the thickness of the membrane portion is increased toward the border between the membrane portion and the substrate.

(5) A photomask for near-field exposure according to aspect (1), in which the structure is such that the thickness of the shielding membrane around the membrane portion is larger than that in the center portion of the membrane portion.

(6) A photomask for near-field exposure according to aspect (1), in which the structure is composed of a reinforcing member placed at the border between the membrane portion and the substrate.

(7) A photomask for near-field exposure according to aspect (1), in which the structure is composed of another layer provided on the shielding membrane around the membrane portion.

(8) A photomask for near-field exposure according to aspect (2), in which the structure is an intermediate layer that is formed between the substrate and the membrane portion and stretches from a peripheral region of the photomask toward a center of the photomask.

(9) A photomask for near-field exposure according to aspect (1), in which the structure disperses, over the substrate, deformation of the membrane portion at the border between the membrane portion and the substrate.

(10) A photomask for near-field exposure according to aspect (9), in which the structure is such that the thickness of the substrate is decreased toward the border between the membrane portion and the substrate.

(11) A photomask for near-field exposure according to aspect (1), in which the structure splits vertical displacement caused by sagging of the membrane portion between at least two locations.

(12) A photomask for near-field exposure according to aspect (11), in which the structure is a deformable concave portion or a hole structure that is formed in a region around the membrane portion and/or in the substrate.

(13) A photomask for near-field exposure according to aspect (12), in which the concave portion is filled with a material other than that of the substrate.

(14) A photomask for near-field exposure according to aspect (11), in which the structure is a movable portion that is formed outside the substrate along the border between the membrane portion and the substrate.

(15) A photomask for near-field exposure according to aspect (14), in which, when the membrane portion sags, the movable portion changes the position of the substrate to cause vertical displacement of the membrane portion.

(16) A photomask for near-field exposure according to aspect (15), in which vertical displacement arises in the membrane portion, which is caused by the movable portion being larger than the sagging amount of the membrane portion.

(17) A photomask for near-field exposure according to aspect (14), in which the movable portion is an elastic hinge structure.

(18) A photomask for near-field exposure according to aspect (14), in which the movable portion is a blade spring.

A photomask according to the present invention includes a stress relieving structure. The stress relieving structure relieves stress concentrating locally on the border between the membrane portion and a substrate, and thus, the durability of the photomask can be improved.

Further, according to the present invention, there is provided a near-field exposure method for exposing an object to be exposed to light including: fitting a shielding membrane of a photomask for near-field exposure to the object; and irradiating the object with light from a light source through the shielding membrane, the photomask being composed of a substrate and a membrane portion that is supported by the substrate and has on one side of the membrane portion the shielding membrane, the shielding membrane having a micro aperture,
in which the photomask has a structure for relieving stress that is generated in the border between the membrane portion and the substrate when the membrane portion sags.

In addition, the present invention provides a near-field exposure apparatus including:
a light source;
a stage on which an object to be exposed to light is placed; and
a photomask composed of a substrate and a membrane portion, the membrane portion being supported by the substrate and having on one side of the membrane portion a shielding membrane that has a micro aperture,
in which the shielding membrane is brought into close contact with the object placed on the stage so that the object is irradiated with light from the light source through the shielding membrane for exposure; and
the photomask has a structure for relieving stress that is generated in the border between the membrane portion and the substrate when the membrane portion sags.

DESCRIPTION OF THE PREFERRED EMBODIMENTS

According to the present invention, a mask is provided with a structure that prevents stress from concentrating on a narrow border portion between a membrane portion and a substrate, and relieves the stress when the membrane portion is sagged and deformed in a process of bringing the mask in close contact with a resist. The stress concentration relieving structure can provide at least one of the following effects:

One effect is to expand a region to which the stress is applied and thereby to disperse the stress. In the conventional structure, the membrane portion is allowed to deform until it reaches the very border of the substrate, while the shape of the substrate remains unchanged. This causes the deformation of the membrane portion to concentrate on the border portion 106 (FIG. 11B) of the membrane portion, concentrating the stress in the narrow region. By dispersing and relieving the deformation of the membrane portion, the region to which the stress is applied is expanded and the distortion energy per unit area is reduced. As a result, the durability of the mask is improved.

The deformation, or the stress, can be dispersed by making the deformation or stress disperse over the membrane portion, or over the substrate, instead of only at the border between the substrate and the membrane portion.

Another effect is to split the stress by dividing a region to which the stress is applied into two or more. When the stress concentrates on a narrow region, the border portion 106 (FIG. 11B) of the membrane portion is sharply deformed. With the stress applied to plural regions, the membrane portion is deformed step by step and the stress level of each region is lowered. The stress concentrated on a narrow region is thus split to improve the durability of the mask.

Specifically, the substrate is provided with a movable portion and displacement of the movable portion partially substitutes for sagging deformation of the mask. The movable portion allows the substrate to change its position in a direction perpendicular to the surface of the membrane portion, so that the membrane portion fixed to the substrate is shifted vertically. In this way, the membrane portion is less sagged in order to bring the mask in close contact with the resist, and the stress is thus relieved.

This structure makes it possible to increase the distance between a mask and a resist before the mask is sagged, thereby enhancing the durability of the mask, as well as decreasing the level of the machine precision required to control the mask-resist distance, thereby improving the throughput. In addition, the structure makes it possible to expose a large area to light.

The present invention will be described below through more specific examples.

Embodiment 1

Figure 1A:
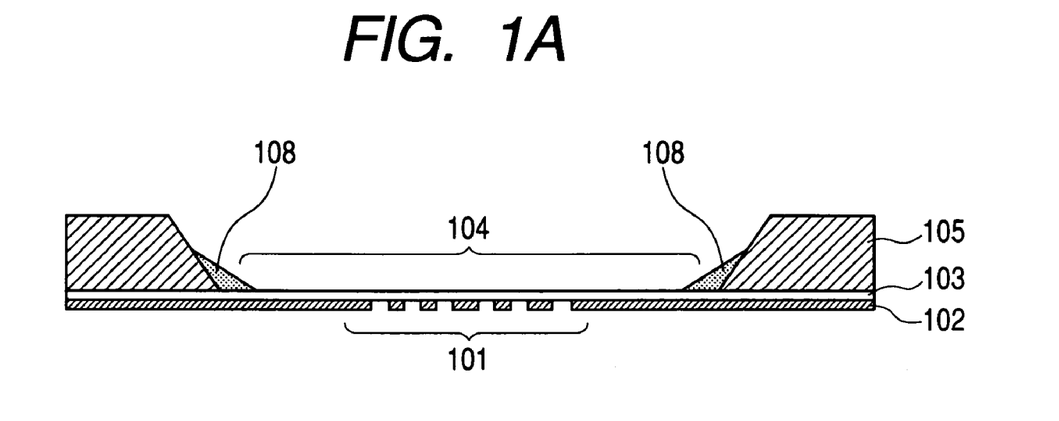
FIGS. 1A and 1B are diagrams showing a structure of a photomask according to Embodiment 1.

A first stress dispersing structure of the present invention is shown in FIG. 1A. FIG. 1A illustrates a photomask for near-field exposure in which a reinforcing member constituting the stress dispersing structure is formed around a membrane portion.

A method of manufacturing this photomask will be described below with reference to FIGS. 2A to 2F.

Figure 2A:
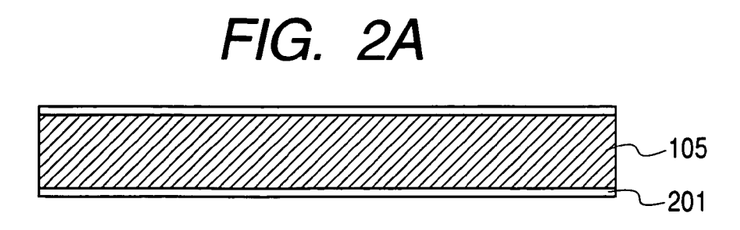
FIGS. 2A, 2B, 2C, 2D, 2E and 2F are diagrams showing a process of manufacturing a photomask according to Embodiment 1.

(1) A membrane parent material 201 is formed into a film on each side of a photomask substrate 105 (FIG. 2A).

Figure 2B:
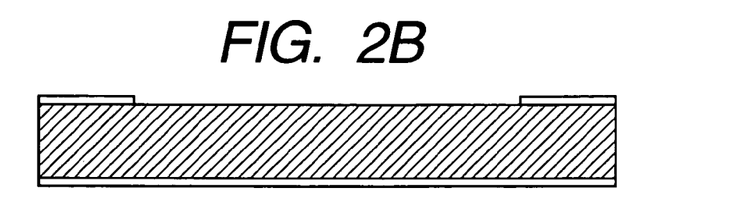

(2) The membrane parent material 201 on one side of the substrate 105 is positioned and patterned so that the parent material serves as an etching mask for forming a membrane portion (FIG. 2B).

Figure 2C:
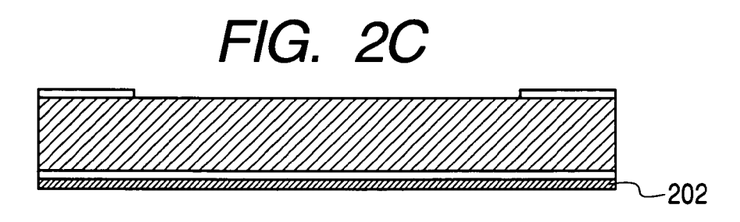

(3) A shielding membrane 202 is formed on the membrane parent material 201, which is not patterned on the other side (FIG. 2C).

Figure 2D:
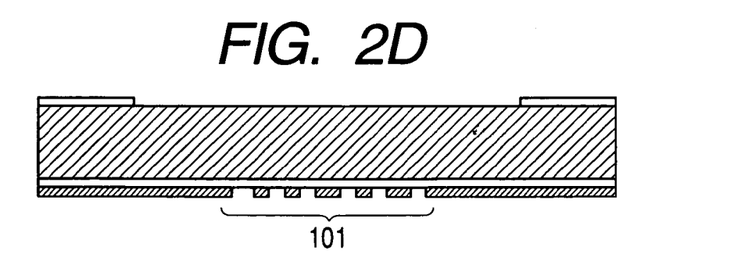

(4) A portion of the shielding membrane 202 that has no level difference is processed to form a light exposure pattern 101, which is a fine pattern, or the like, used to expose a resist to light (FIG. 2D).

Figure 2E:
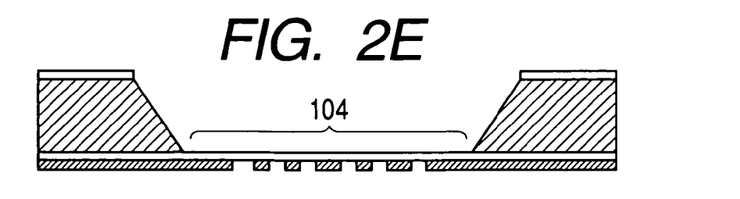
Figure 2F:
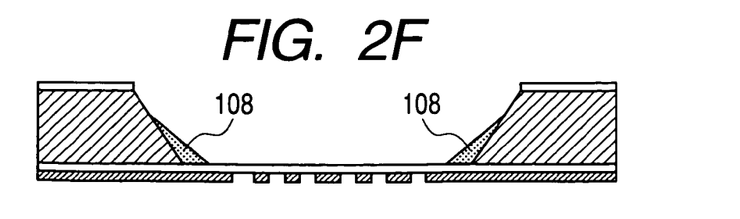

(5) The membrane parent material patterned in FIG. 2B is used to etch the substrate 105 and thereby to form a membrane portion 104 (FIG. 2E).

Although the step of forming the membrane portion 104 by etching the substrate 105 is the last step in the above description, this is not fixed, and the membrane portion 104 may be formed before forming the shielding membrane, or after the shielding membrane is formed and before the level difference structure is formed.

(6) Lastly, a reinforcing member 108, which is a stress relieving structure is formed around the membrane portion.

Figure 1B:
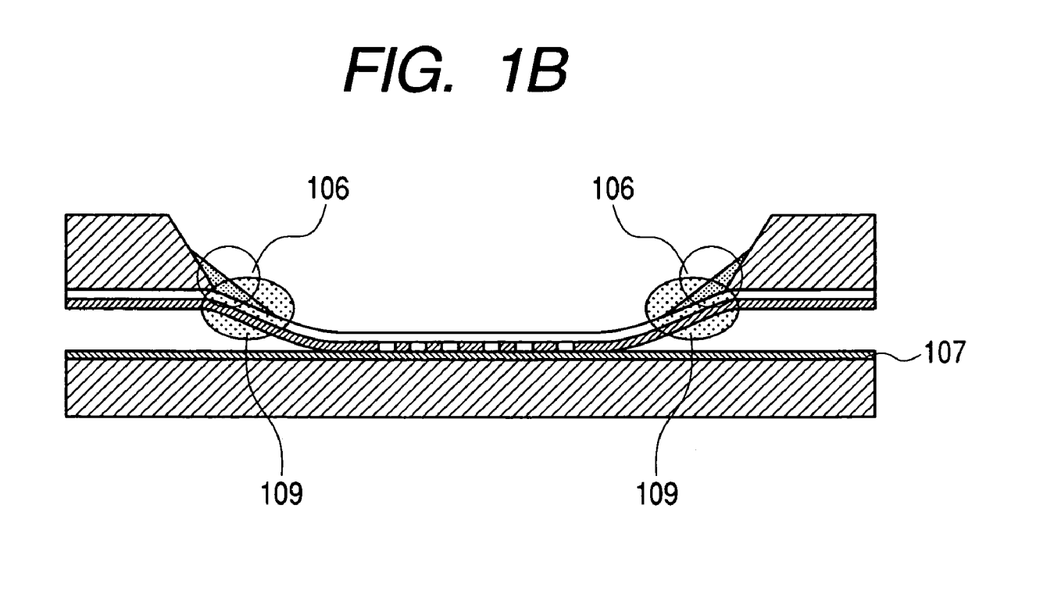

The material and thickness of the reinforcing member are adjusted such that a border portion 106 is deformed gently, instead of sharply, as shown in FIG. 1B, when the membrane portion 104 sags in the process of exposure. For example, the reinforcing member 108 is formed only around the membrane portion from a high viscosity polymer or gel using a spin coater or an evaporator. Another example is to form the reinforcing member 108 only around the membrane portion (on the membrane parent material including the vicinity of the substrate) by oblique evaporation.

The membrane portion 104 of the thus obtained photomask for near-field exposure is sagged to bring the photomask to come in close contact with a photoresist 107. Compared to the sharp deformation of the border portion 106 in FIG. 11B, a part of the membrane portion 104 that abuts the border of the substrate is supported by the stress relieving structure 108 and is deformed gently, as shown in FIG. 1B. The stress applied to the membrane portion is dispersed over a stress relieving portion 109 inside (the membrane portion side) the border so that, accordingly, the durability of the photomask is improved.

Embodiment 2

Figure 3A:
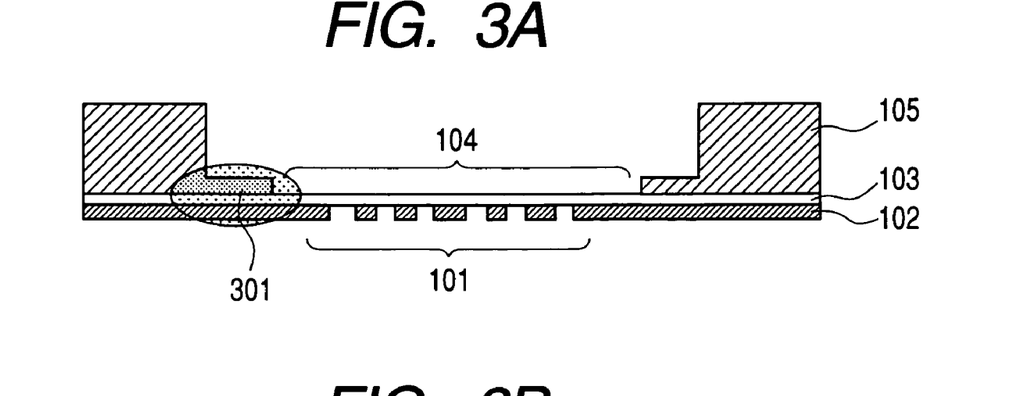
FIGS. 3A, 3B, 3C and 3D are diagrams showing structures of photomasks according to Embodiments 2 and 3.

A second stress dispersing structure of the present invention is shown in FIG. 3A. FIG. 3A illustrates a photomask for near-field exposure in which a stress dispersing structure is formed by varying the thickness of a substrate around a membrane portion. The substrate is thinned near the border between the substrate and the membrane portion.

The structure in FIG. 3A can be manufactured by approximately the same method as the one illustrated in FIGS. 2A to 2F. The difference is that, in this case, FIG. 2E is replaced by two-step dry etching for etching the substrate and forming the membrane portion. A level difference in the substrate can be adjusted by controlling the depth for dry etching in the first step. A level difference region of the substrate can be adjusted by controlling the area to be dry-etched in the first and second steps.

By adjusting the substrate level difference and the substrate level difference region, the degree of relief of stress concentration is adjusted.

When the membrane portion is sagged, the substrate, which is formed thin around the membrane portion, is caused to sag along with the membrane portion. A mask parent material portion is supported by a level difference in the substrate, in other words, the stress is dispersed over a thin stress relieving portion 301 on the substrate side, in this embodiment, instead of the border between the membrane portion and the substrate. Therefore, sharp deformation of the membrane portion is relieved and the durability of the photomask is improved.

In this embodiment, the substrate level difference region serving as a stress relieving structure is integrated with the substrate. Accordingly, this embodiment is capable of avoiding risks of lowering the exposure accuracy and breaking the mask, which are otherwise due to misalignment caused by repeatedly sagging the photomask to change the stress relieving structure.

Figure 3B:
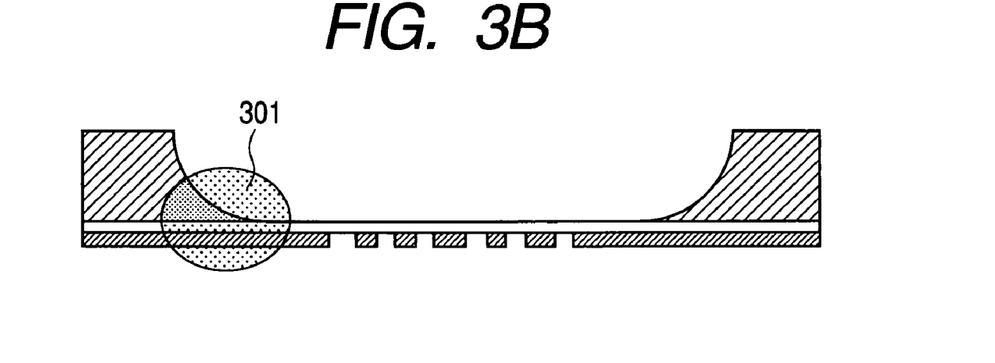

An example of modifying the stress dispersing structure of this embodiment is shown in FIG. 3B. FIG. 3B illustrates a photomask in which a stress dispersing structure is formed by varying the thickness of a substrate around a membrane portion in a continuous manner.

The structure in FIG. 3B can be manufactured by approximately the same method as the one illustrated in FIGS. 2A to 2F. The difference is that, in this modification example, FIG. 2E is replaced by isotropic etching for etching the substrate and forming the membrane portion. When Si is used for the substrate, a mixture of hydrofluoric acid, nitric acid, and acetic acid, for example, is used as an etchant for wet etching to obtain the structure of FIG. 3B. The radius of curvature of the etching is adjusted by adjusting the mixing ratio of the above three acids in the etchant.

When the membrane portion is sagged, the substrate 105 around the membrane portion is caused to sag gently, since the substrate 105 is thinned toward the membrane portion. A membrane parent material 103, which is formed around the membrane portion and is supported by the substrate, also sags gently. The stress is dispersed more over a stress relieving portion 301, as in Embodiment 2, thus relieving sharp deformation of the membrane portion. As a result, the durability of the photomask is improved even more.

Also, in this embodiment, the substrate level difference region serving as a stress relieving structure is integrated with the substrate. Accordingly, this embodiment is capable of avoiding risks of lowering the exposure accuracy and breaking the mask, which are due to misalignment caused by repeatedly sagging the photomask to change the stress relieving structure.

In addition, the membrane portion 104 and the stress relieving structure are formed at the same time by wet etching, thus reducing the number of steps for manufacturing a mask and improving the throughput of mask manufacture.

Embodiment 3

While a stress relieving structure is formed by varying the thickness of a photomask substrate in Embodiment 2, a third stress dispersing structure of this embodiment is obtained by increasing the thickness of a membrane portion near the border between the membrane portion and a substrate.

Figure 3C:
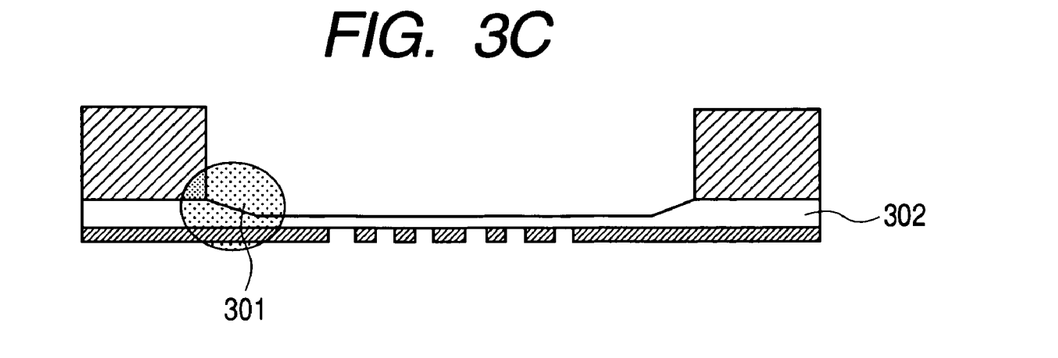

In a structure shown in FIG. 3C, the thickness of a membrane parent material 302 is increased only around a membrane portion.

Figure 3D:
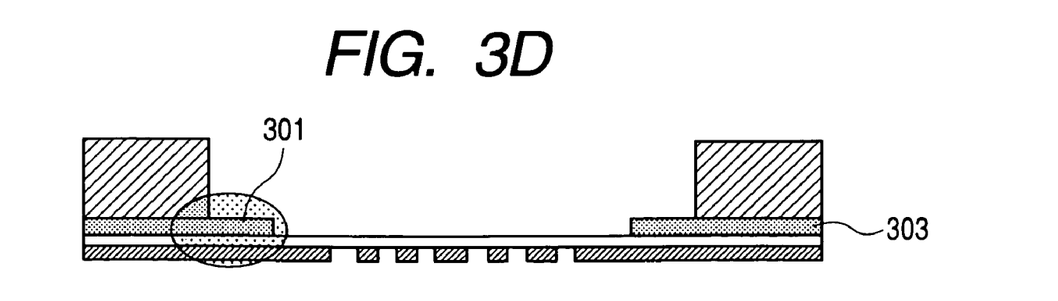

In a structure shown in FIG. 3D, an intermediate layer 303 is provided between a membrane portion and a substrate to support the region around the membrane portion in a stepped manner. With either of the stress relieving structures, a thick part of the membrane portion that is inside (the membrane portion side) the border between the membrane portion and the substrate serves as a stress relieving portion 301, and deformation is dispersed over the region 301. Thus, sharp deformation of the membrane portion is relieved, and the stress is dispersed. The photomask durability is, therefore, improved.

Embodiment 4

Figure 4A:
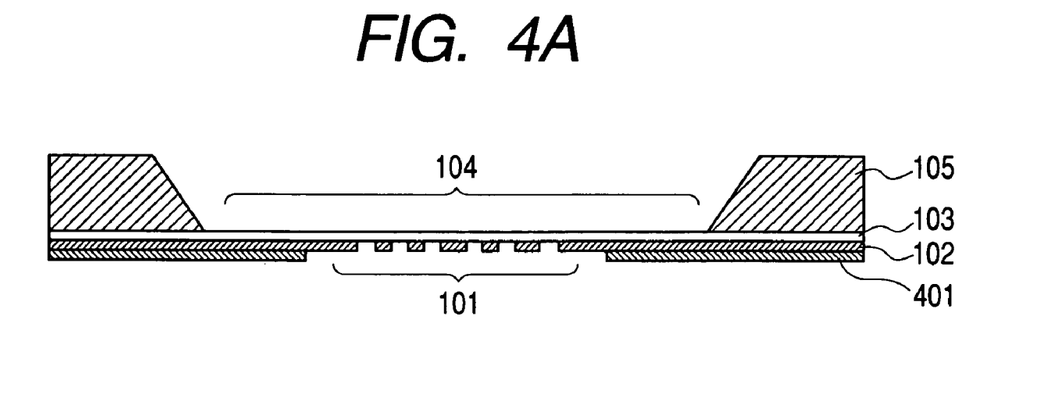
FIGS. 4A and 4B are diagrams showing a structure and an operation of a photomask according to Embodiment 4.

The thick part of the membrane portion (the thick portion of the membrane parent material 302 or the intermediate layer 303), which is on the side opposite to the shielding membrane in Embodiment 3, may be formed on the shielding membrane side. This photomask structure is a fourth stress dispersing structure of the present invention, and is shown in FIG. 4A. In the structure of FIG. 4A, a level difference structure 401 is provided on the shielding membrane side of a membrane portion and the thickness of the membrane portion is increased near the border between the membrane portion and a substrate.

A process of manufacturing the photomask according to Embodiment 4 will be described below with reference to FIGS. 5A to 5F.

Figure 5A:
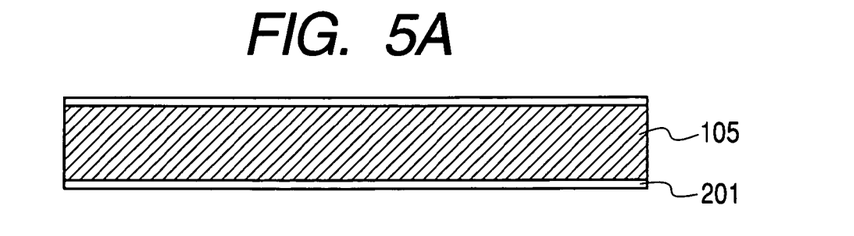
FIGS. 5A, 5B, 5C, 5D, 5E and 5F are diagrams showing a process of manufacturing a photomask according to Embodiment 4.

(1) First, a membrane parent material 201 is formed into a film on each side of a photomask substrate 105 (FIG. 5A).

Figure 5B:
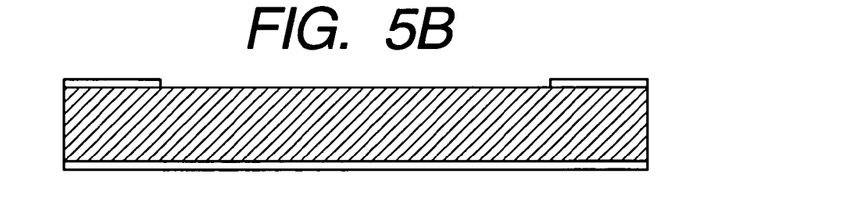

(2) The membrane parent material 201 on one side of the substrate 105 is positioned and patterned so that the parent material serves as an etching mask for forming a membrane portion (FIG. 5B).

Figure 5C:
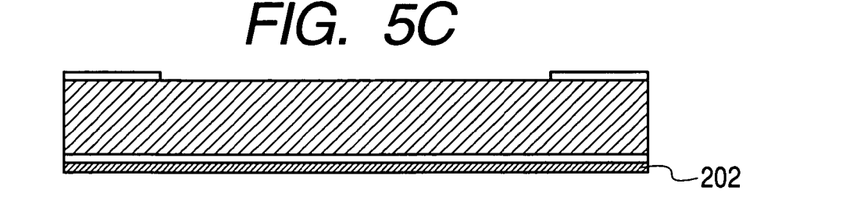

(3) A shielding membrane 202 is formed on the membrane parent material 201 that is not patterned on the other side (FIG. 5C).

Figure 5D:
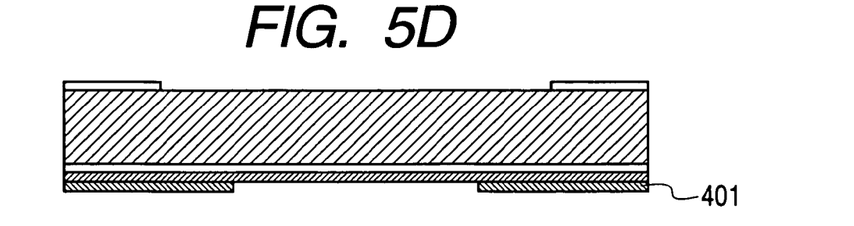

(4) A film to form the level difference structure 401 is formed on the shielding membrane 202. The level difference structure can be formed from any material as long as it can create a level difference from the shielding membrane and it is readily peeled off of a resist. However, the use of metal for the level difference structure makes the process easy. Examples of employable metals include Cr, Ag, Au, Ta, and Al. A resist is applied to the level difference structure 401 followed by light exposure by a normal exposure apparatus and development to obtain a resist structure, which extends inward beyond a membrane portion 104. The level difference structure 401 is formed by evaporating and depositing the material of the level difference structure and then removing the resist (FIG. 5D).

Figure 5E:
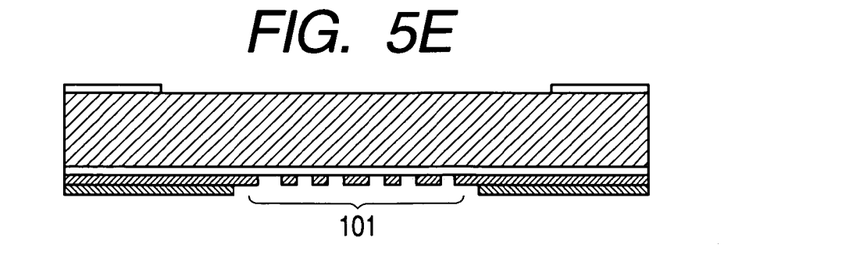

(5) A portion of the shielding membrane 202 that has no level difference is processed to form a light exposure pattern 101, which is a fine pattern, or the like, used to expose a resist to light (FIG. 5E).

Figure 5F:
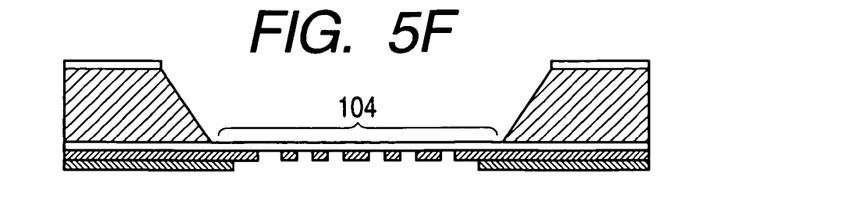

(6) The membrane parent material patterned in FIG. 5B is used to etch the substrate 105 and thereby to form a membrane portion 104 (FIG. 5F).

Although the step of forming the membrane portion 104 by etching the substrate 105 is the last step in the above, this is not fixed, and the membrane portion 104 may be formed before forming the shielding membrane, or after the shielding membrane is formed and before the level difference structure is formed.

Figure 4B:
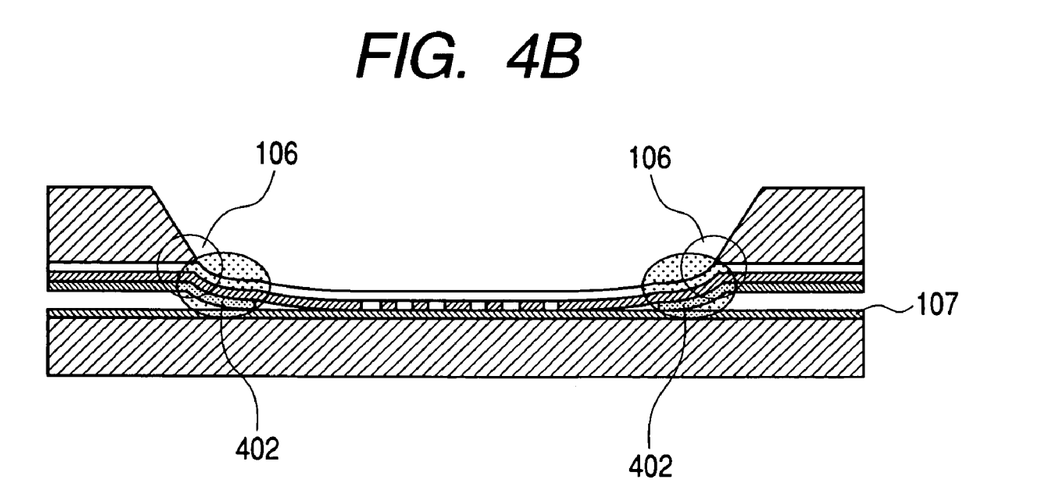

The membrane portion 104 of the photomask sags to decrease the distance between the light exposure pattern 101 and a photoresist 107 for exposure (FIG. 4B). Then, the level difference structure 401 causes the membrane portion to deform in two stages and the stress that has concentrated on a border portion 106 is dispersed over a stress relieving portion 402.

The stress relieving structure in which a level difference is formed in the shielding membrane to relieve concentration of the stress brought by the sagged membrane portion improves the durability of the photomask.

A metal film separate from the shielding film is used to form the level difference structure 401 in the above example. Alternatively, the level difference structure 401 may be formed by varying the thickness of the shielding membrane 102 in such a manner that the thickness of the shielding film varies to achieve the structure of FIGS. 4A and 4B. This structure can be obtained by forming the shielding membrane with two stages. With the shielding membrane 102 and the level difference structure 401 unitarily formed, it is possible to avoid a risk of peeling-off caused between the shielding membrane 102 and the level difference structure 401 when fitting and peeling of the photomask is repeated.

Embodiment 5

Figure 6A:
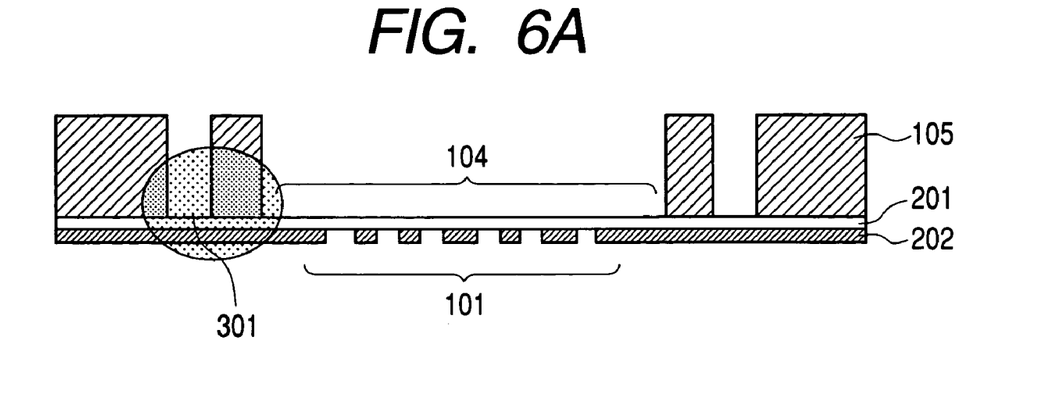
FIGS. 6A, 6B and 6C are diagrams showing structures of photomasks according to Embodiment 5.

A first stress splitting structure of the present invention is shown in FIG. 6A. FIG. 6A illustrates a photomask for near-field exposure in which a stress relieving membrane portion is formed as a stress splitting structure outside a substrate that surrounds a membrane portion.

The structure in FIG. 6A can be manufactured by almost the same method as the one illustrated in FIGS. 2A to 2F. A mask pattern is formed such that a stress relieving membrane portion is formed around a membrane portion when manufacturing the mask for forming the membrane portion of FIG. 2B. The etching in FIG. 2E completes the structure of FIG. 6A.

The stress relieving membrane portion surrounds the periphery of the substrate around the membrane portion 104, which is in close contact with the surface to be exposed to light. When the light exposure pattern is brought into close contact with a photoresist in the exposure process, the stress relieving membrane portion and the membrane portion that has the light exposure pattern sag separately. As a result, the stress is split. With the stress split, sharp deformation of the membrane portion is relieved and the photomask is improved in durability.

In addition, since the stress relieving membrane portion can be formed at the same time of forming the membrane portion 104 having the light exposure pattern, the throughput in manufacturing a mask is improved.

MODIFICATION EXAMPLE 1

Figure 6B:
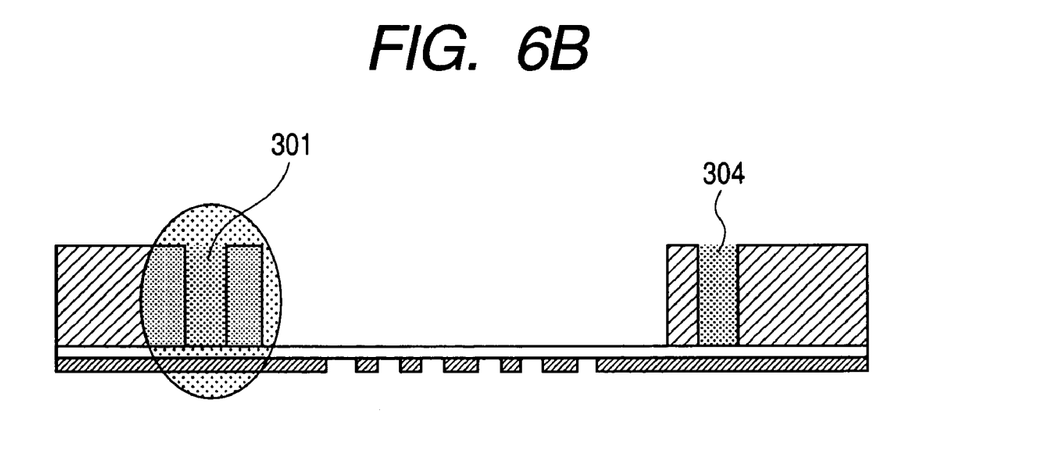

As shown in FIG. 6B, a hole created in the surrounding substrate 105 in order to form a stress splitting membrane portion may be filled with a material other than the substrate 105.

The structure shown in FIG. 6B can be manufactured by almost the same method as the one used to fabricate the structure shown in FIG. 6A. A hole created around the membrane portion may be filled after the structure shown in FIG. 6A is completed. However, in order to avoid a risk of breaking the membrane portion by impact applied in handling, it is preferable to set etching of the membrane portion as a last step in which a hole in the substrate 105 around the membrane portion is created first by etching. The hole is filled with a material having a Young's modulus smaller than that of the substrate 105.

The material having a Young's modulus smaller than that of the substrate 105 includes an organic material, such as a resist, a high viscosity polymer or gel, and metal. The material is, for example, poured or deposited by evaporation to fill the hole.

Obtained by filling the hole is a filling structure 304, the material and thickness of which is adjusted to have an elastic constant lower than that of the substrate 105.

With the filling structure 304 provided around the membrane portion, the stress is split between the filling structure 304 and the membrane portion having the light exposure pattern when the light exposure pattern is brought into close contact with the photoresist in the exposure process. Since the stress is split, sharp deformation of the membrane portion is relieved and the photomask is improved in durability.

MODIFICATION EXAMPLE 2

Figure 6C:
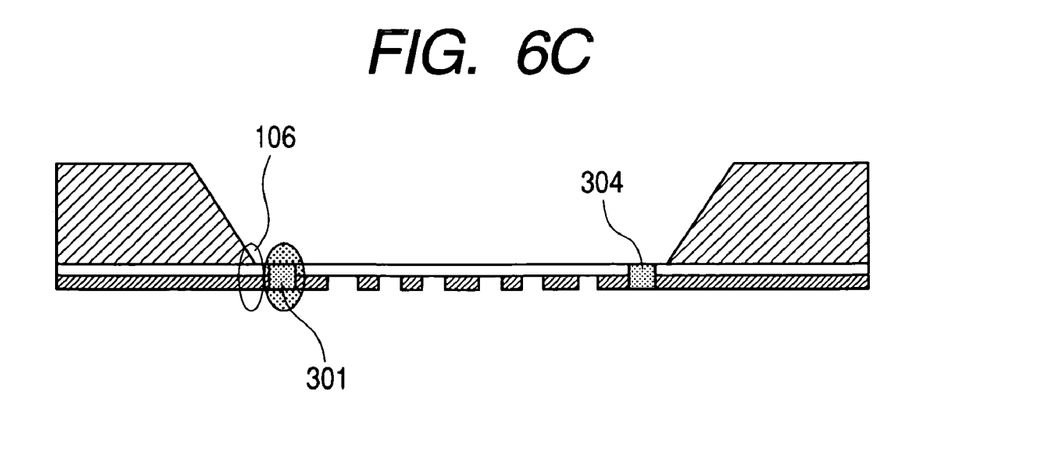

The filling structure 304 may be placed in a region around the membrane portion 104 where the light exposure pattern 101 is not formed (FIG. 6C). In this case, a filling material that is low in transmittance of exposure light is employed. If a filling material that is transmissive of exposure light is employed, the hole is formed in a location where the light exposure pattern does not affect the performance of the device to be manufactured.

In this case, the hole may not be filled if gas leakage does not significantly interfere with control of pressure for sagging the membrane portion.

With this structure, the membrane portion is deformed in a border portion 106 and in a stress relieving portion 301 separately. The stress is thus split, relieving sharp deformation of the membrane portion and improving the durability of the photomask.

Embodiment 6

Figure 7A:
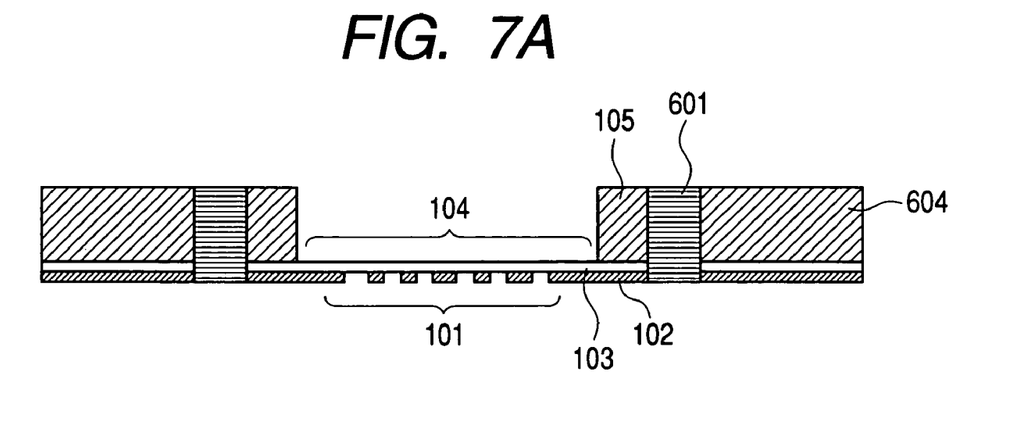
FIGS. 7A, 7B and 7C are diagrams showing a structure and an operation of a photomask according to Embodiment 6.

A second stress splitting structure of the present invention is shown in FIG. 7A. FIG. 7A illustrates an example in which a movable portion is formed as a stress splitting structure around a substrate 105 of a photomask. The movable portion may be an elastic body, a mechanical movable mechanism, an electrical movable mechanism, or the like. Here, an elastic hinge structure 601 is formed around a mask substrate by utilizing a micromachining process. The movable portion is supported by a substrate 604, which is outside of the elastic hinge structure 601.

The elastic hinge structure 601 is elastically deformed due to a difference in atmospheric pressure or upon application of fluid pressure, electrostatic force, electromagnetic force, or the like, thereby causing the substrate to change its position in a direction perpendicular to the surface to be exposed to light. It is also possible to deform the elastic hinge structure by creating an atmospheric pressure difference between above and below the structure.

Figure 7B:
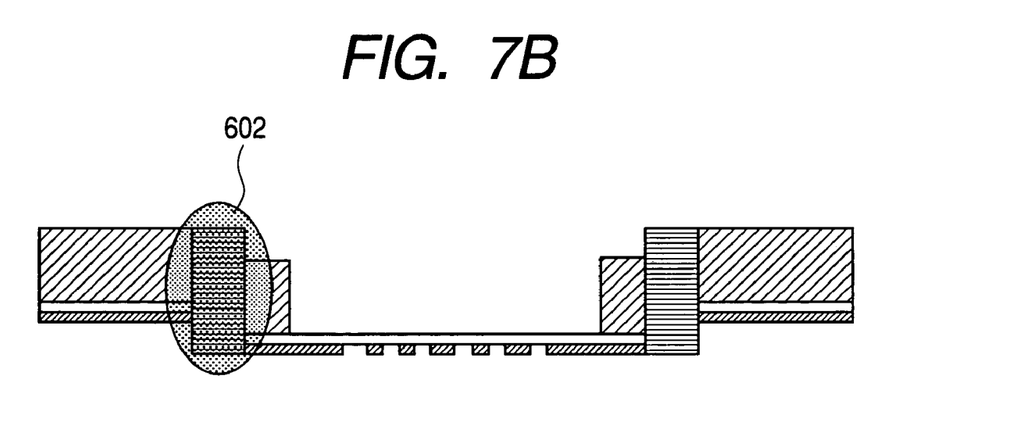
Figure 7C:
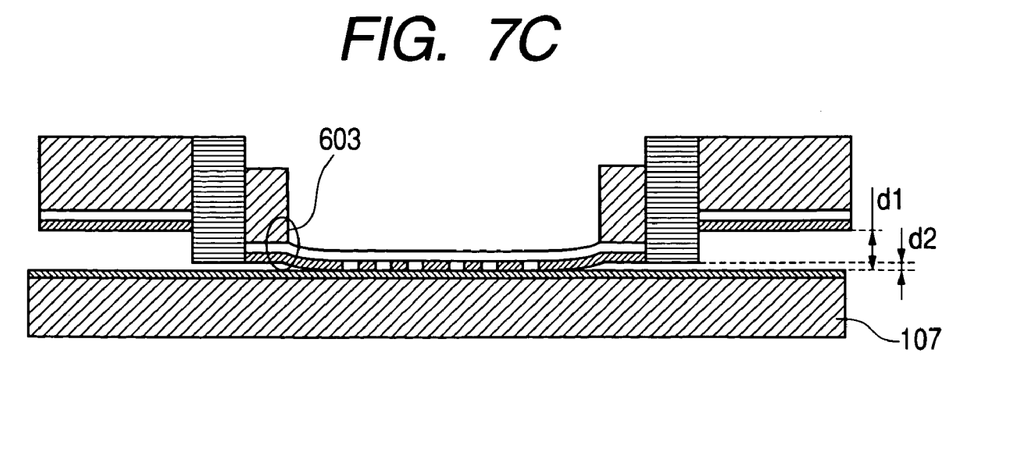

Using this photomask, a photoresist is exposed to light as follows:

The elastic hinge structure 601 is deformed to bring the membrane portion 104 together with the substrate close to the surface to be exposed to light (FIG. 7B). The membrane portion 104 is further sagged utilizing a pressure difference, or the like (FIG. 7C). Then, a light exposure pattern 101 is fit to an object to be exposed to light (photoresist 107), which is placed on a stage (not shown in the drawings). The object to be exposed to light (photoresist 107) is irradiated with light from a light source (not shown in the drawings) for exposure through a membrane parent material 103 and a shielding membrane 102.

After the exposure, the pressure difference, or the like, is returned to the initial setting (or set to the opposite value) to undo the sagging of the membrane portion 104. Then, the elastic hinge structure 601 is driven to return to the initial state (FIG. 7A).

Alternatively, the membrane portion may be sagged by creating a difference in atmospheric pressure on each side of the mask, while at the same time, the identical atmospheric pressure difference is given to the elastic hinge structure to deform the structure.

The deformation of the elastic hinge structure 601 causes the substrate to move down in the vertical direction and, accordingly, the membrane portion similarly moves down. The movement closes the distance between the membrane portion and the surface to be exposed to light, which are largely apart from each other before the deformation. Therefore, compared to a case where no elastic hinge structure is provided, a less amount of sagging of the membrane portion is required in order to fit to the surface to be exposed to light.

The above-described exposure method using a photomask of the present invention is also applicable for the photomasks of other embodiments and modification examples.

The mask-resist distance, which is large before the deformation (FIG. 7A), is changed to be smaller by deforming the movable portion and, thus, moving the membrane portion along with the substrate, as shown in FIG. 7B. How far the membrane portion is moved is indicated by distance d1 in FIG. 7C. As a result of the movement, the mask-resist distance is reduced to distance d2 in FIG. 7C. Since the membrane portion has to be sagged only by distance d2, the stress is relieved more than when no movable portion is provided.

The sagging amount of the membrane portion 104 is reduced by a stress relieving portion 602 and, therefore, the stress applied to a border portion 603 of the membrane portion can be reduced. The stress, which concentrates on the border portion 106 in FIGS. 11A and 11B, is split between the stress relieving portion 602 and the border portion 603 in FIGS. 7A to 7C. The photomask is thus improved in durability.

The outer substrate 604 connected to the membrane portion 104 through the elastic hinge structure 601 is fixed to a stage for adjusting the mask-resist distance. In this way, the position of the mask relative to the resist can be changed while the distance between the substrate 604 and the photoresist 107 remains large. This allows for the use of an inexpensive stage and, therefore, is advantageous.

A parallel blade spring 702 (FIG. 8B) or blade spring 703 (FIG. 8C) made of phosphor bronze, or the like, may be interposed as a movable portion between the inner substrate 105 and the outer substrate 604 to join the substrates. The spring 702 or 703, or the like, that does not have an external driving mechanism may be deformed by utilizing the pressure difference for making the membrane portion 104 sag. The spring 702 or 703 does not have to be as thin as the membrane portion, and, therefore, may be sagged more than the membrane portion 104 by adjusting the elasticity of the spring.

Embodiment 7

In Embodiment 6, an elastic hinge structure is obtained by micromachining employed for the movable portion for splitting the stress in the membrane portion by reducing the membrane mask-resist distance in part. Alternatively, an actuator 701 of FIG. 8A may be employed. The actuator may be of the electrostatic type, magnetic force type, or piezoelectric type, or may be a linear motor or a piezo mechanism.

Figure 8A:
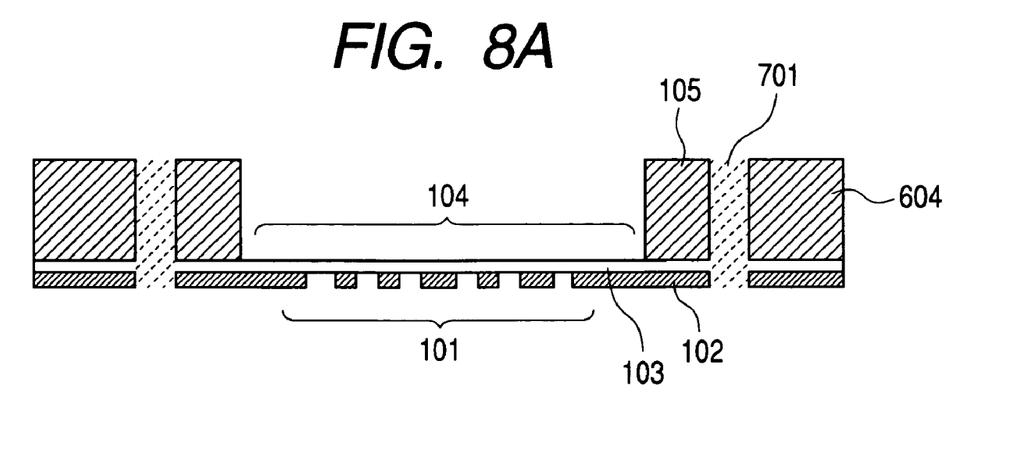
FIGS. 8A, 8B and 8C are diagrams showing the structure of the photomask according to Embodiment 7.
Figure 8B:
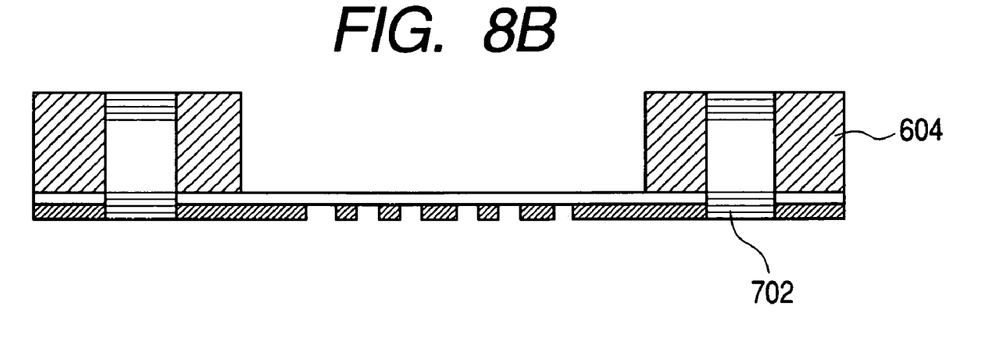
Figure 8C:
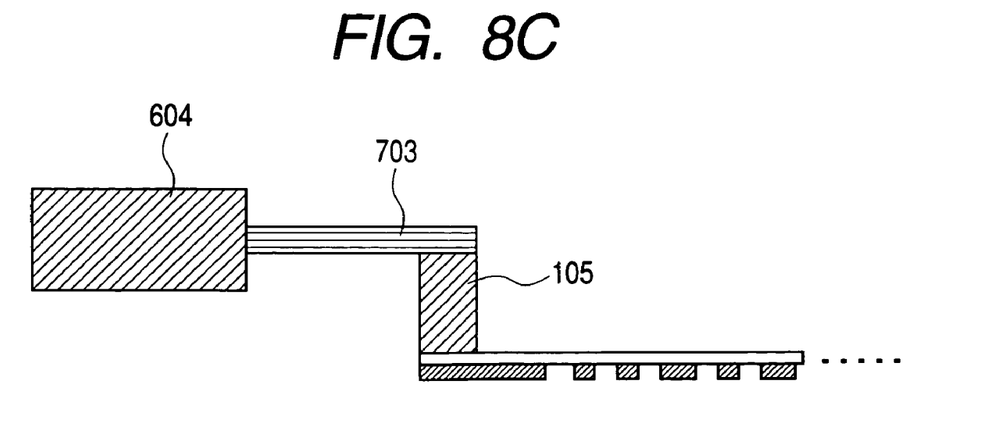

In the case of a motor, piezo mechanism, or the like, that has an external driving mechanism, the mechanism is driven to reduce the distance between a light exposure pattern 101 on the mask and a photoresist. Then, a membrane portion 104 is sagged.

The photomask durability can be improved also by combining the methods shown in the above seven embodiments. In this case, attention needs to be paid so that stress concentrated portions of the methods are positioned in different locations.

Figure 9A:
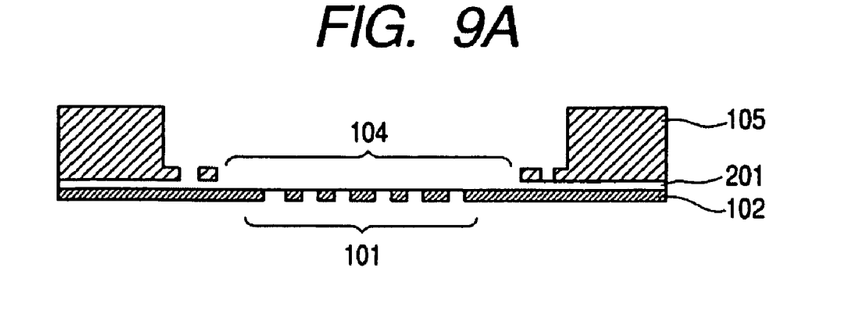
FIGS. 9A and 9B are diagrams showing the structure of the photomask according to Embodiment 7.
Figure 9B:
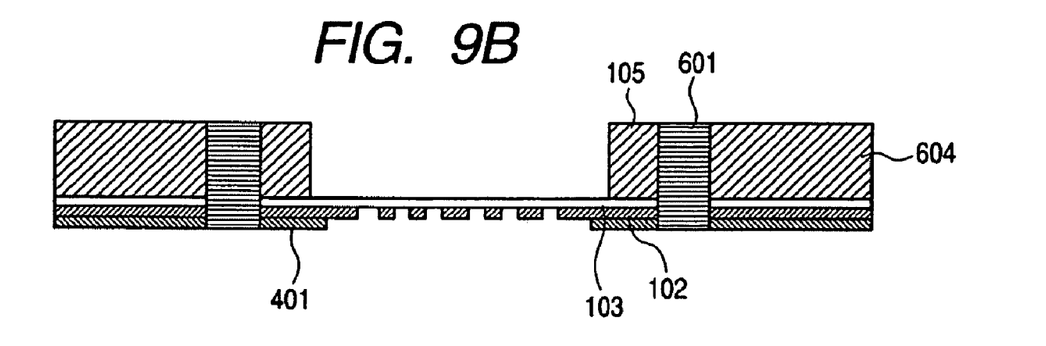

For instance, a level difference structure may be formed in a substrate while the level difference structure is provided with a notch structure (FIG. 9A). Another example is to form the level difference structure 401, and then form the elastic hinge structure 601 (FIG. 9B).

As has been described, according to the present invention, a stress relieving structure is given to a photomask for near-field exposure, which has a membrane portion. The stress relieving structure relieves stress concentrated locally on the border between the membrane portion and a substrate, and thus, the durability of the photomask is improved.

CLAIM OF PRIORITY

This application claims priority from Japanese Patent Application No. 2003-042090 filed on Feb. 20, 2003, the entire contents of which are incorporated by reference herein.

What is claimed is:

1. A near-field exposure apparatus comprising:
a light source;
a stage on which an object to be exposed to light is placed; and a photomask including:
(i) a deformable membrane portion having on a first surface of the deformable membrane portion a light shielding membrane that has a micro aperture; and
(ii) a substrate for supporting a peripheral region of a second surface of the deformable membrane portion the deformable membrane portion in a sagged condition in close contact with the object, the photomask has a stress relieving structure to relieve stress that is generated at a border between the deformable membrane portion and the substrate when the deformable membrane portion sags, and the stress relieving structure is one selected from the following:
(a) a means comprising a reinforcing member placed at the border,
(b) a means such that the substrate is partially thinned near the border, and
(c) a means comprising an intermediate layer that is formed between the second surface of the deformable membrane portion in which the intermediate layer stretches from the peripheral region toward a center of the second surface of the deformable membrane portion.

2. A near-field exposure photomask comprising:
a deformable membrane portion having on a first surface of the deformable membrane portion a light shielding membrane that has a micro aperture; and
a substrate for supporting a peripheral region of a second surface of the deformable membrane portion,
wherein exposure is conducted with the deformable membrane portion in a sagged condition, the near-field exposure photomask has a stress relieving structure to relieve stress that is generated at a border between the deformable membrane portion and the substrate when the deformable membrane portion sags, and the stress relieving structure is one selected from the following:
(a) a means comprising a reinforcing member placed at the border,
(b) a means such that the substrate is partially thinned near the border, and
(c) a means comprising an intermediate layer that is formed between the substrate and the second surface of the deformable membrane portion in which the intermediate layer stretches from the peripheral region toward a center of the second surface of the deformable membrane portion.

* * * * *

UNITED STATES PATENT AND TRADEMARK OFFICE
CERTIFICATE OF CORRECTION

PATENT NO. : 7,190,438 B2 Page 1 of 1
APPLICATION NO. : 10/779786
DATED : March 13, 2007
INVENTOR(S) : Takako Yamaguchi et al.

It is certified that error appears in the above-identified patent and that said Letters Patent is hereby corrected as shown below:

ON THE TITLE PAGE:
In item "(56) References Cited," under "FOREIGN PATENT DOCUMENTS," the second-listed document "JP   61065250 A  *   4/1986" should read
-- JP   61-065250 A  *  4/1986 --.

COLUMN 11:
Line 21, "less" should read -- lesser --.

COLUMN 12:
Line 36 Claim 1, after "and" the right margin should be closed up and a new paragraph begun on the next line with "a photomask including:"
Line 41 Claim 1, "portion" should read -- portion, --.
Line 42 Claim 1, "the" should read -- wherein exposure is conducted with the --.
Line 54 Claim 1, "between the" should read -- between the substrate and the --.

Signed and Sealed this

Twentieth Day of November, 2007

JON W. DUDAS
*Director of the United States Patent and Trademark Office*